(12) United States Patent
Kakiuchi

(10) Patent No.: US 10,785,880 B2
(45) Date of Patent: Sep. 22, 2020

(54) ELECTRODE CONNECTING METHOD

(71) Applicant: Brother Kogyo Kabushiki Kaisha, Nagoya-shi, Aichi-ken (JP)

(72) Inventor: Toru Kakiuchi, Chita-gun (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 83 days.

(21) Appl. No.: 15/940,446

(22) Filed: Mar. 29, 2018

(65) Prior Publication Data

US 2019/0098768 A1 Mar. 28, 2019

(30) Foreign Application Priority Data

Sep. 26, 2017 (JP) ................. 2017-184829

(51) Int. Cl.
*H05K 3/46* (2006.01)
*H05K 3/36* (2006.01)
*H05K 3/22* (2006.01)
*H05K 1/11* (2006.01)
*H05K 3/32* (2006.01)

(52) U.S. Cl.
CPC ............ *H05K 3/4614* (2013.01); *H05K 1/11* (2013.01); *H05K 3/227* (2013.01); *H05K 3/36* (2013.01); *H05K 3/368* (2013.01); *H05K 3/323* (2013.01); *H05K 2201/0129* (2013.01); *H05K 2201/068* (2013.01); *H05K 2203/0278* (2013.01); *H05K 2203/1105* (2013.01)

(58) Field of Classification Search
CPC .... H05K 3/4614; H05K 3/4617; H05K 3/462; H05K 3/227; H05K 2201/068; B29C 66/0242; B29C 66/3464; B29C 65/66; B29C 65/665; B32B 37/144; B32B 2038/006

USPC .................................................. 156/84, 322
See application file for complete search history.

(56) References Cited

U.S. PATENT DOCUMENTS 6,045,743 A * 4/2000 Iwai ................. H01L 21/56
264/345
2007/0000689 A1* 1/2007 Ishimaru ............ H05K 1/0271
174/255

FOREIGN PATENT DOCUMENTS

JP 2002329958 A * 11/2002
JP 2009-239023 A 10/2009

OTHER PUBLICATIONS

Machine translation of JP 2002329958 date unknown.*

* cited by examiner

*Primary Examiner* — John L Goff, II
(74) *Attorney, Agent, or Firm* — Banner & Witcoff, Ltd.

(57) ABSTRACT

An electrode connecting method includes: producing (i) a first circuit board including first electrodes spaced at a first distance and (ii) a second circuit board having a thermal expansion rate less than that of the first circuit board and including second electrodes spaced at a second distance, such that a difference in dimension between the first distance and the second distance falls within a particular permissible range; dehydrating the first circuit board so as to reduce the first distance; causing the first electrodes and the second electrodes to be respectively opposed to each other, with a thermosetting adhesive interposed between the first circuit board and the second circuit board; heating the thermosetting adhesive and at least the first circuit board of the first circuit board and the second circuit board; and bringing the first circuit board and the second circuit board into pressing contact with each other.

16 Claims, 8 Drawing Sheets

FIG.6

|  |  | EXAMPLE | FIRST COMPARATIVE EXAMPLE | SECOND COMPARATIVE EXAMPLE |
|---|---|---|---|---|
| FIRST CIRCUIT BOARD | THERMAL EXPANSION RATE | 5ppm/deg | 5ppm/deg | 10ppm/deg |
|  | HUMIDITY EXPANSION RATE | 10ppm/%RH | 10ppm/%RH | 10ppm/%RH |
|  | WIDTH | 36mm | 36mm | 36mm |
|  | CUMULATIVE PITCH CORRECTION RATE | 1.0 | 1.0 | 1.0 |
| DEHYDRATING PROCESS | TEMPERATURE | 150°C | × | 150°C |
|  | TIME | 10min | × | 10min |
| FIRST HEATING PROCESS | TEMPERATURE | 75°C | 75°C | 75°C |
| SECOND HEATING PROCESS | TEMPERATURE | 180°C | 180°C | 180°C |
| ALIGNMENT BETWEEN FIRST ELECTRODES AND SECOND ELECTRODES | | ○ | × | × |

ELECTRODE CONNECTING METHOD

CROSS REFERENCE TO RELATED APPLICATION

The present application claims priority from Japanese Patent Application No. 2017-184829, which was filed on Sep. 26, 2017, the disclosure of which is herein incorporated by reference in its entirety.

BACKGROUND

The following disclosure relates to an electrode connecting method.

There is known a conventional electrode connecting method in which a first circuit board is provided with a plurality of first extended electrodes arranged parallel with each other with a constant pitch. Also, a second circuit board is provided with a plurality of second extended electrodes arranged parallel with each other with non-constant pitches. The first and second circuit boards are positioned to each other such that the center of the plurality of first extended electrodes in its arrangement direction coincides with the center of the plurality of second extended electrodes in its arrangement direction. The first circuit board and the second circuit board are then heated such that the pitch of the first extended electrodes and the pitch of the second extended electrodes become equal to each other, whereby the first extended electrodes and the respective second extended electrodes are connected to each other.

SUMMARY

In the above-described electrode connecting method, the first circuit board and the second circuit board are heated such that the pitch of the first extended electrodes and the pitch of the second extended electrodes become equal to each other. Thus, when the temperature of the first circuit board and the second circuit board has lowered to a normal temperature, the pitch of the first extended electrodes and the pitch of the second extended electrodes are to change back to those before heating. However, the pitch of the first extended electrodes is constant, and the pitches of the second extended electrodes are not constant before heating, resulting in difference in pitch between the first extended electrodes and the second extended electrodes. This difference may lead to stress on each of the circuit boards, causing separation between the circuit boards.

Accordingly, an aspect of the disclosure relates to an electrode connecting method capable of reducing separation of a circuit board.

In one aspect of the disclosure, an electrode connecting method includes: a step of producing (i) a first circuit board including a plurality of first electrodes spaced at a first distance and (ii) a second circuit board having a thermal expansion rate less than that of the first circuit board and including a plurality of second electrodes spaced at a second distance, such that a difference in dimension between the first distance and the second distance falls within a particular permissible range; a dehydrating step of dehydrating the first circuit board so as to reduce the first distance; a step of causing the plurality of first electrodes and the plurality of second electrodes to be respectively opposed to each other, with a thermosetting adhesive interposed between the first circuit board and the second circuit board; a heating step of heating the thermosetting adhesive and at least the first circuit board of the first circuit board and the second circuit board; and a step of bringing the first circuit board and the second circuit board into pressing contact with each other.

BRIEF DESCRIPTION OF THE DRAWINGS

The objects, features, advantages, and technical and industrial significance of the present disclosure will be better understood by reading the following detailed description of the embodiment, when considered in connection with the accompanying drawings, in which:

FIG. 6 is a table indicating one example of the electrode connecting method according to the embodiment;

DETAILED DESCRIPTION OF THE EMBODIMENT

Figure 1:
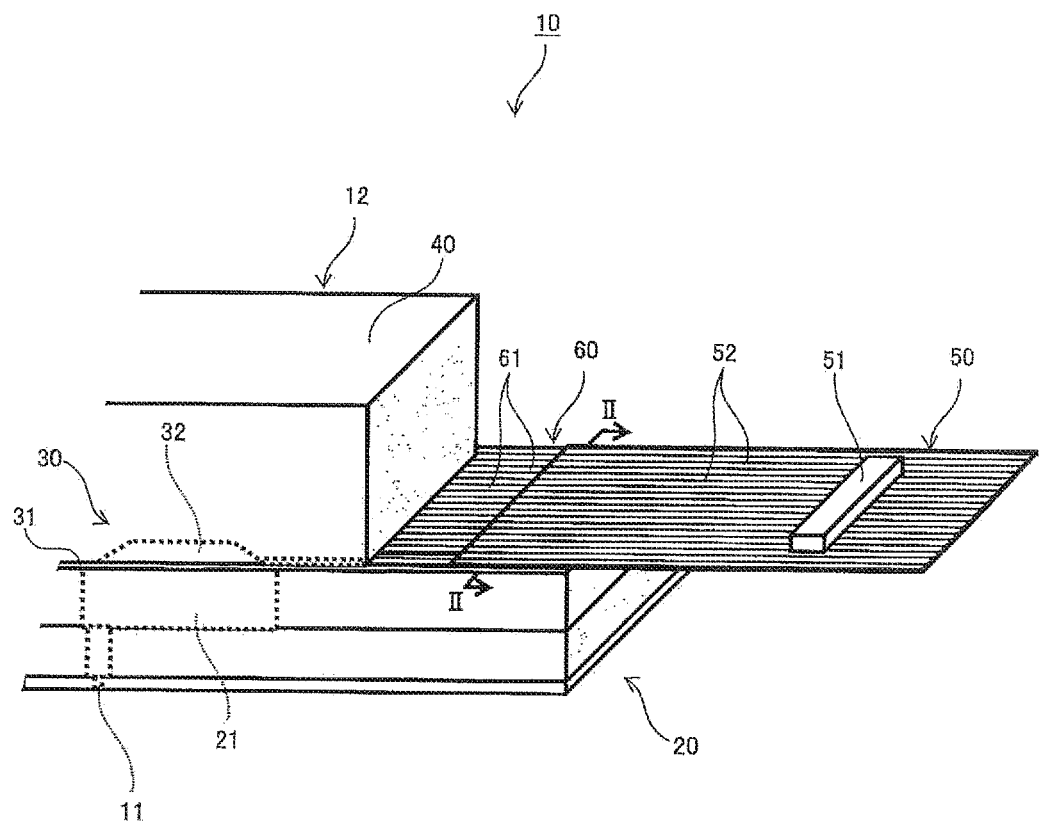
FIG. 1 is a schematic perspective view of a liquid ejection apparatus to which an electrode connecting method according to one embodiment is applied.

Hereinafter, there will be described one embodiment by reference to the drawings. It is noted that the same reference numerals are used for components which are the same as or corresponding to each other in all the drawings, and a duplicate explanation of which is dispensed with.

Liquid Ejection Apparatus

An electrode connecting method according to one embodiment is applied to a liquid ejection apparatus 10. As illustrated in FIG. 1, the liquid ejection apparatus 10 is a printer including a head 12 having nozzles 11. The liquid ejection apparatus 10 ejects liquid, such as ink, from the nozzles 11 to record an image on a recording medium such as a sheet. A device to which the electrode connecting method is applied is not limited to the liquid ejection apparatus 10 as long as electrodes are connected to the device.

The head 12 includes a liquid-passage defining plate 20, a driving unit 30, a protector 40, and a first circuit board 50. The liquid-passage defining plate 20 has the nozzles 11 and pressure chambers 21 communicating with the respective nozzles 11. The driving unit 30 includes a vibration plate 31 and piezoelectric elements 32. The piezoelectric elements 32 are arranged on the vibration plate 31 so as to correspond to the respective pressure chambers 21. The protector 40 is disposed on the vibration plate 31 so as to protect the piezoelectric elements 32. A second circuit board 60 is electrically connected to electrodes of the respective piezoelectric elements 32. The second circuit board 60 extends outward from the protector 40 so as to be electrically connected to the first circuit board 50. The second circuit board 60 will be described later in detail.

The first circuit board 50 is a circuit board on which a driver IC 51 is mounted. The first circuit board 50 is electrically connected at its one end to the second circuit board 60 and electrically connected at the other end to a controller, not illustrated. Based on signals transmitted from the controller, the driver IC 51 creates drive signals for driving the piezoelectric elements 32 and outputs the drive signals to the electrodes of the respective piezoelectric elements 32 via the second circuit board 60. When one of the piezoelectric elements 32 is deformed, and thereby the vibration plate 31 is displaced, pressure is applied to the liquid in a corresponding one of the pressure chambers 21 to eject the liquid from the nozzle 11 communicating with the pressure chamber 21. The first circuit board 50 will be described later in detail.

First Circuit Board and Second Circuit Board

As illustrated in FIG. 1, the first circuit board 50 is a circuit board film formed using a Chip-on-Film (COF) technology, for example. On the first circuit board 50 is mounted a semiconductor chip, such as the driver IC 51, electrically connected to first wires 52 formed on a surface of the first circuit board 50. Copper (Cu) coated with tin (Sn) plating is used for the first wires 52, for example. The second circuit board 60 is micro-electromechanical systems (MEMS), for example. Second wires 61 are formed on a surface of the second circuit board 60. An alloy of gold (Au) and aluminum (Al) is used for each of the second wires 61, for example.

Since the first circuit board 50 and the second circuit board 60 are different form each other in material, a thermal expansion rate a of the first circuit board 50 and a thermal expansion rate b of the second circuit board 60 are different from each other. For example, the first circuit board 50 is formed of resin such as polyimide, and the second circuit board 60 is formed of a material such as silicon. In this case, the thermal expansion rate a of the first circuit board 50 is greater than the thermal expansion rate b of the second circuit board 60. The first circuit board 50 contracts by dehydration and expands by moisture absorption.

Figure 2:
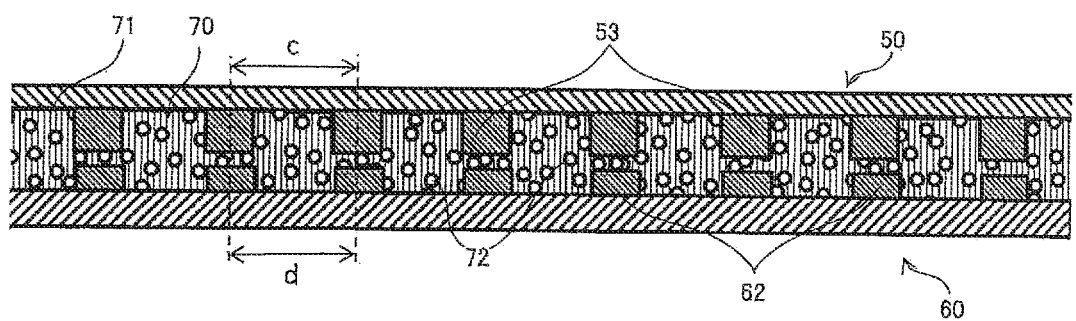
FIG. 2 is a partial cross-sectional view taken along line II-II in FIG. 1.

As illustrated in FIG. 2, the first circuit board 50 includes a plurality of first electrodes 53 spaced at a first distance c. The first electrodes 53 are provided at distal end portions of the respective first wires 52 (see FIG. 1) and connected to a plurality of second electrodes 62, respectively. The first distance c is a dimension between the centers of adjacent two of the first electrodes 53 in a direction in which the first electrodes 53 are arranged (hereinafter may be referred to as "arrangement direction"). For example, the first distance c is 21 μm (1200 dpi). The second circuit board 60 includes the second electrodes 62 spaced at a second distance d. The second electrodes 62 are provided at distal end portions of the respective second wires 61 (see FIG. 1) and connected to the respective first electrodes 53. The second distance d is a dimension between the centers of adjacent two of the second electrodes 62 in the arrangement direction.

The first circuit board 50 and the second circuit board 60 are bonded to each other by a thermosetting adhesive 70. For example, the thermosetting adhesive 70 is an anisotropic conductive film (ACF) formed of thermosetting resin 71 containing conductive particles 72. The first electrodes 53 of the first circuit board 50 and the second electrodes 62 of the second circuit board 60 are electrically connected to each other by the conductive particles 72 interposed therebetween.

Electrode Connecting Method

Figure 3A:
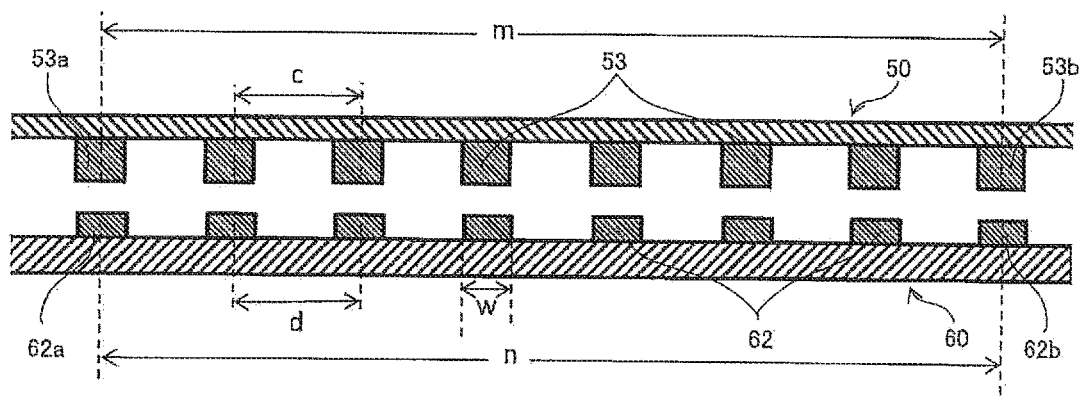
FIG. 3A is a cross-sectional view of a first circuit board and a second circuit board in a producing process.

In the electrode connecting method according to the present embodiment, a producing process illustrated in FIG. 3A is performed first. In this process, the first circuit board 50 and the second circuit board 60 are produced such that a difference between the first distance c and the second distance d falls within a particular permissible range. This particular permissible range is a range in which the first electrodes 53 and the respective second electrodes 62 can be opposed to each other.

Figure 3B:
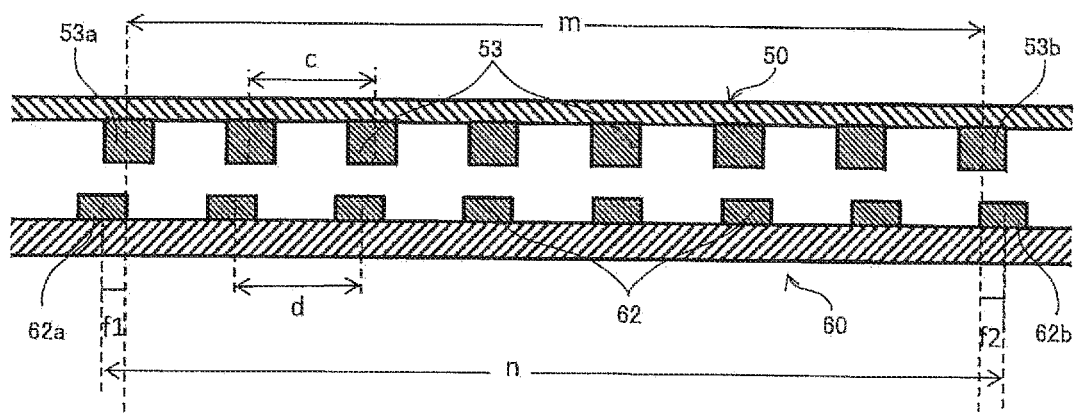
FIG. 3B is a cross-sectional view of the first circuit board and the second circuit board after a dehydrating process.

In a subsequent dehydrating process illustrated in FIG. 3B, the first circuit board 50 is dehydrated and thereby contracted, resulting in reduction in the first distance c. In the dehydrating process, for example, the first circuit board 50 is left for a particular heating time in a heating furnace kept at a particular heating temperature. The heating temperature, for example, is greater than equal to 120° C. and less than or equal to 170° C. and preferably is equal to 150° C. The heating time, for example, is greater than equal to five minutes and less than or equal to fifteen minutes and preferably is equal to ten minutes. This heating easily dehydrates the first circuit board 50.

Figure 4A:
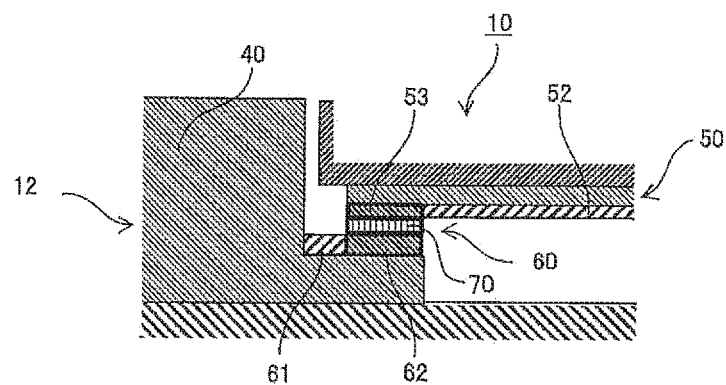
FIG. 4A is a cross-sectional view of the first circuit board and the second circuit board in an opposing process.

In a subsequent opposing process illustrated in FIG. 4A, the first electrodes 53 and the second electrodes 62 are respectively opposed to each other with the thermosetting adhesive 70 interposed therebetween. This process may be performed such that the thermosetting adhesive 70 is bonded to a surface (an electrode surface) of the first circuit board 50 on which the first electrodes 53 are arranged, and then the first circuit board 50 is placed on the second circuit board 60 with the thermosetting adhesive 70 interposed between the electrode surface of the first circuit board 50 and an electrode surface of the second circuit board 60.

Also, the opposing process is performed such that the center of a region in which the first electrodes 53 are arranged (hereinafter may be referred to as "arrangement region of the first electrodes 53") in the arrangement direction coincides with the center of a region in which the second electrodes 62 are arranged (hereinafter may be referred to as "arrangement region of the second electrodes 62) in the arrangement direction. Furthermore, the first electrodes 53 and the second electrodes 62 are positioned to each other such that the first electrodes 53 and the second electrodes 62 respectively overlap each other in the arrangement direction. In other words, the first electrodes 53 and the second electrodes 62 are positioned to each other such that the first electrodes 53 and the second electrodes 62 respectively overlap each other when viewed in a direction perpendicular to the arrangement direction and a direction each of the first wires 52 and the second electrodes 62 extends. As a result, the first electrodes 53 and the second electrodes 62 are respectively opposed to each other.

Figure 4B:
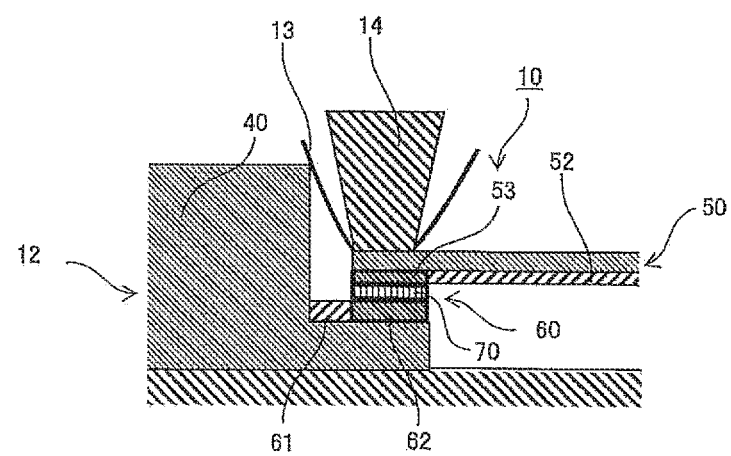
FIG. 4B is a cross-sectional view of the first circuit board and the second circuit board in a pressing-contact process.

A heating process and a pressing-contact process are thereafter performed as illustrated in FIG. 4B. In the heating process, the thermosetting adhesive 70 and at least the first circuit board 50 of the first circuit board 50 and the second circuit board 60 are heated. This heating process may be performed in two steps (i.e., a first heating process and a second heating process).

A heating temperature in the first heating process is set to a temperature greater than or equal to a temperature at which the thermosetting adhesive 70 is softened by heat and less than a temperature at which the thermosetting adhesive 70 is hardened. For example, the temperature in the first heating process is set to 75° C. As a result, the thermosetting adhesive 70 has viscosity. Here, a cloth 13 is placed on the first circuit board 50, and the first circuit board 50 is pressed against the second circuit board 60 via the cloth 13 by a pressing member 14, for example. As a result, the first circuit board 50 and the second circuit board 60 are brought into (indirect) pressing contact with each other and thereby bonded to each other temporarily.

A heating temperature in the second heating process is set to a temperature greater than the temperature in the first heating process and greater than or equal to the temperature at which the thermosetting adhesive 70 is hardened. For example, the temperature in the second heating process is set to 180° C. Thus, heating in the second heating process thermally expands the first circuit board 50, resulting in increase in the first distance c in the first circuit board 50. Since the thermal expansion rate a of the first circuit board 50 is greater than the thermal expansion rate b of the second circuit board 60, the first distance c is increased by an amount greater than that of increase in the second distance d. Here, since the first distance c is reduced in the dehydrating process performed before the heating process, the first distance c is increased such that the first electrodes 53 and the second electrodes 62 are returned to their original positions at which the first electrodes 53 and the second electrodes 62 are respectively opposed to each other.

Here, the first circuit board 50 is pressed against the second circuit board 60 by the pressing member 14 via the cloth 13 to bring the first circuit board 50 and the second circuit board 60 into pressing contact with each other, for example. As a result, as illustrated in FIG. 2, the first electrodes 53 and the second electrodes 62 are respectively electrically connected to each other with the conductive particles 72 interposed therebetween. Hardening of the thermosetting adhesive 70 fixes the first circuit board 50 and the second circuit board 60.

When the first circuit board 50 is thereafter left in an environment at a normal temperature and a normal humidity, the first circuit board 50 is contracted by being cooled to the normal temperature from a heated temperature raised in the heating process. In contrast, the first circuit board 50 expands by moisture absorption in a normal-humidity state in which humidity is higher than that in the dehydration state. The contraction and the expansion reduce change in the first distance c, thereby keeping the first electrodes 53 and the second electrodes 62 opposed to each other. This reduces stress on the first circuit board 50, making it possible to reduce separation between the first circuit board 50 and the second circuit board 60 due to stress.

In the above-described electrode connecting method, the first circuit board 50 is contracted in the dehydrating process performed before the heating process, thereby reducing stress imposed on the first circuit board 50. Thus, even in the case where an adhesive force between the first circuit board 50 and the second circuit board 60 is considerably small due to the considerably short first distance c of 21 µm, for example, it is possible to reduce separation between the first circuit board 50 and the second circuit board 60 due to stress.

Since the materials for the first circuit board 50 and the second circuit board 60 are different from each other, a difference in thermal expansion rate between the first circuit board 50 and the second circuit board 60 easily generates stress on the first circuit board 50 in the heating process. In the present embodiment, however, the first circuit board 50 is contracted in the dehydrating process performed before the heating process, which offsets the difference in thermal expansion rate, resulting in reduced stress due to the difference in thermal expansion rate.

Since the first circuit board 50 is contracted in the dehydrating process performed before the heating process, it is possible to reduce positional misalignment between the first electrodes 53 and the second electrodes 62 at the normal temperature and the normal humidity after the pressing contact. Thus, the conductive particles 72 contained in the thermosetting adhesive 70 (ACF) are interposed between the first electrodes 53 and the respective second electrodes 62, making it possible to maintain electrical connection between the first electrodes 53 and the second electrodes 62.

First Distance, Water Content, and Stress

Figure 5A:
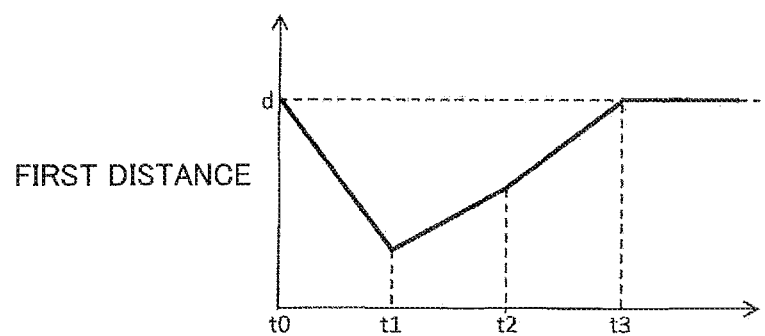
FIG. 5A is a graph indicating changes of a first distance with time.
Figure 5B:
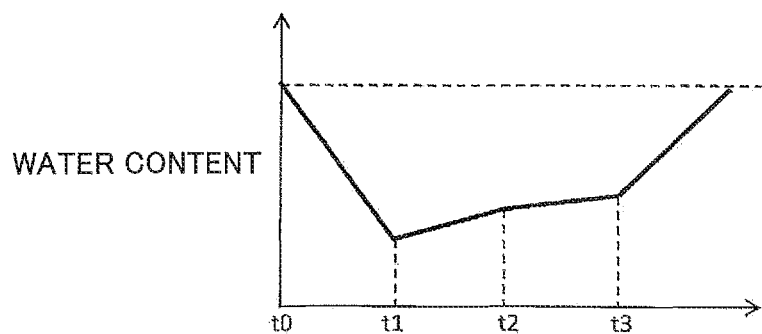
FIG. 5B is a graph indicating changes in water content of the first circuit board with time.
Figure 5C:
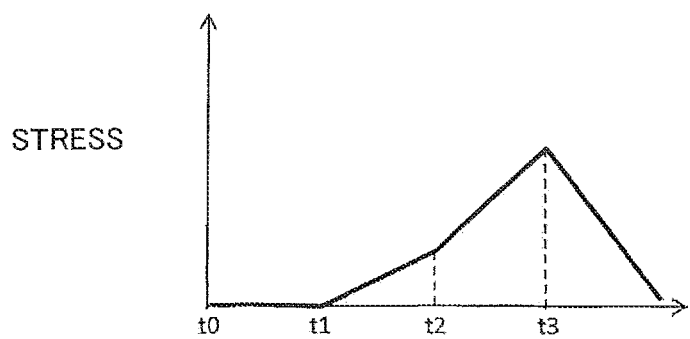
FIG. 5C is a graph indicating changes in stress on the first circuit board with time.

Changes in the first distance c in the first circuit board 50, water content of the first circuit board 50 (i.e., an amount of water in the first circuit board 50), and stress on the first circuit board 50 in the above-described electrode connecting method were examined. FIGS. 5A-5C illustrate a result of this examination. As illustrated in FIG. 5A, the first distance c is made equal to the second distance d in the producing process at time t0. When the dehydrating process is started at time t0, as illustrated in FIG. 5B, the water content decreases with proceeding of the dehydrating process. Since the first circuit board 50 contracts with decrease in the water content, the first distance c decreases as illustrated in FIG. 5A. It is noted that, since the first circuit board 50 and the second circuit board 60 are not in contact with each other in the period t0-t1, as illustrated in FIG. 5C, no stress is imposed on the first circuit board 50 by the second circuit board 60 in this period in the case where the first distance c has changed.

At time t1, the first heating process is started after the first electrodes 53 and the second electrodes 62 are respectively opposed to each other, with the thermosetting adhesive 70 interposed therebetween. In the first heating process in the period t1-t2, as illustrated in FIG. 5B, the first circuit board 50 absorbs a small amount of moisture, and the water content of the first circuit board 50 increases by a small amount. This moisture absorption expands the first circuit board 50, resulting in a small amount of increase in the first distance c as illustrated in FIG. 5A. Since the first circuit board 50 and the second circuit board 60 are bonded to each other by the thermosetting adhesive 70, as illustrated in FIG. 5C, the stress increases with the expansion of the first circuit board 50.

At time t2, the second heating process is started after the first circuit board 50 and the second circuit board 60 are temporarily bonded to each other. In the second heating process in the period t2-t3, the thermosetting adhesive 70 has not been hardened, though the first circuit board 50 and the second circuit board 60 are temporarily bonded to each other. Thus, the first circuit board 50 is movable with respect to the second circuit board 60, and the first distance c increases as illustrated in FIG. 5A. This increase in the first distance c increases stress imposed on the first circuit board 50 as illustrated in FIG. 5C. Also, since the heating temperature in the second heating process is higher than that in the first heating process, as illustrated in FIG. 5B, the rate of increase in the water content lowers.

When the first distance c in FIG. 5A becomes equal to the second distance d at time t3, the first circuit board 50 and the second circuit board 60 are brought into pressing contact with each other and fixed. As a result, the first distance c is constant after time t3. While the first circuit board 50 expands due to increase in the water content in FIG. 5B, the first circuit board 50 contracts by cooling from its high-temperature state established in the second heating process, to its normal-temperature state. The expansion and the contraction decrease the stress in FIG. 5C. This decrease in stress reduces separation between the first circuit board 50 and the second circuit board 60 due to stress.

Example of Electrode Connecting Method According to Embodiment

There will be described an example of the electrode connecting method according to the embodiment with comparative examples. The first electrodes 53 and the respective second electrodes 62 were connected to each other on conditions in the example, a first comparative example, and a second comparative example illustrated in FIG. 6. Conditions other than the conditions illustrated in FIG. 6 are the same among the example, the first comparative example, and the second comparative example.

In the example, the dimension (the width) of the first circuit board 50 in the arrangement direction was made shorter by 7 μm from 36 mm by the contraction in the dehydrating process, so that the width of the first circuit board 50 in the arrangement direction was less than the width of the second circuit board 60 in the arrangement direction. The width of the first circuit board 50 was made longer by the thermal expansion in the first heating process and the second heating process, and the first circuit board 50 and the second circuit board 60 were brought into pressing contact with each other. At this time, the first circuit board 50 and the second circuit board 60 had the same width, and each of the first electrodes 53 and a corresponding opposed one of the second electrodes 62 were located at the same position in the arrangement direction.

In the first comparative example, in contrast, since the dehydrating process was not performed, the width of the first circuit board 50 and the width of the second circuit board 60 were equal to each other at the time before the heating process. Therefore, after the first heating process and the second heating process, the width of the first circuit board 50 was greater than that of the second circuit board 60, thereby causing misalignment between the first electrodes 53 and the second electrodes 62.

The second comparative example used the first circuit board 50 having the thermal expansion rate a of 10 ppm/deg that is greater than the thermal expansion rate a (5 ppm/deg) of the first circuit board 50 in the example. Therefore, the width of the first circuit board 50 was made shorter by the contraction in the dehydrating process, but the thermal expansion in the first heating process and the second heating process made the width of the first circuit board 50 longer by an amount greater than the reduced width in the dehydrating process. As a result, the width of the first circuit board 50 was greater that that of the second circuit board 60, thereby causing misalignment between the first electrodes 53 and the second electrodes 62.

First Modification

There will be next described modifications of the present embodiment. In a first modification, the first circuit board 50 may be dehydrated in the electrode connecting method illustrated in FIGS. 3A-4B such that an amount f of contraction of the first circuit board 50 due to the dehydration is greater than or equal to an amount of contraction of the first circuit board 50 due to change in temperature from the heated temperature to the normal temperature. As illustrated in FIG. 3B, the amount f of contraction is an amount of reduction of the dimension m (the dimension n), i.e., the length of the row of the first electrodes 53, between contacts of opposite end first electrodes 53a, 53b of the first electrodes 53 arranged on the first circuit board 50. As illustrated in FIG. 3B, the amount f of contraction is equal to an amount f1+f2. The contact of each of the first electrodes 53 is located at the center of the first electrode 53 in the arrangement direction, for example.

Thus, a large amount of contraction of the first circuit board 50 in the dehydrating process makes it difficult to cause positional misalignment between the first electrodes 53 and the second electrodes 62 at the normal temperature and the normal humidity after the heating process and the pressing-contact process. For example, a result of an experiment shows that positional misalignment between the first electrodes 53 and the second electrodes 62 at the normal temperature and the normal humidity after the pressing-contact process is smaller, and accordingly stress imposed on the first circuit board 50 is also smaller in the case where the center of each of the first electrodes 53 in the arrangement direction is nearer to the center of the arrangement region of the first electrodes 53 than the center of a corresponding one of the second electrodes 62 after the dehydrating process, than in the case where the center of each of the first electrodes 53 in the arrangement direction is farther from the center of the arrangement region of the first electrodes 53 than the center of the corresponding second electrode 62 after the dehydrating process. In other words, the result of the experiment shows that positional misalignment between the first electrodes 53 and the second electrodes 62 at the normal temperature and the normal humidity after the pressing-contact process is smaller, and accordingly stress imposed on the first circuit board 50 is also smaller in the case where the center of each of the first electrodes 53 is located on an inner side than the corresponding second electrode 62 after the dehydrating process, than in the case where the center of each of the first electrodes 53 is located on an outer side than the corresponding second electrode 62 after the dehydrating process.

Second Modification

In the electrode connecting method as illustrated in FIGS. 3A-4B, the first circuit board 50 may be dehydrated such that the amount f of contraction of the first circuit board 50 due to the dehydration becomes equal to the amount of contraction of the first circuit board 50 due to change in temperature from the heated temperature to the normal temperature. Thus, the amount f of contraction in the dehydrating process is equal to the amount of contraction of the first circuit board 50 by cooling, thereby further reducing positional misalignment between the first electrodes 53 and the second electrodes 62 at the normal temperature and the normal humidity after the pressing-contact process, resulting in further reduced stress imposed on the first circuit board 50.

Third Modification

Figure 7A:
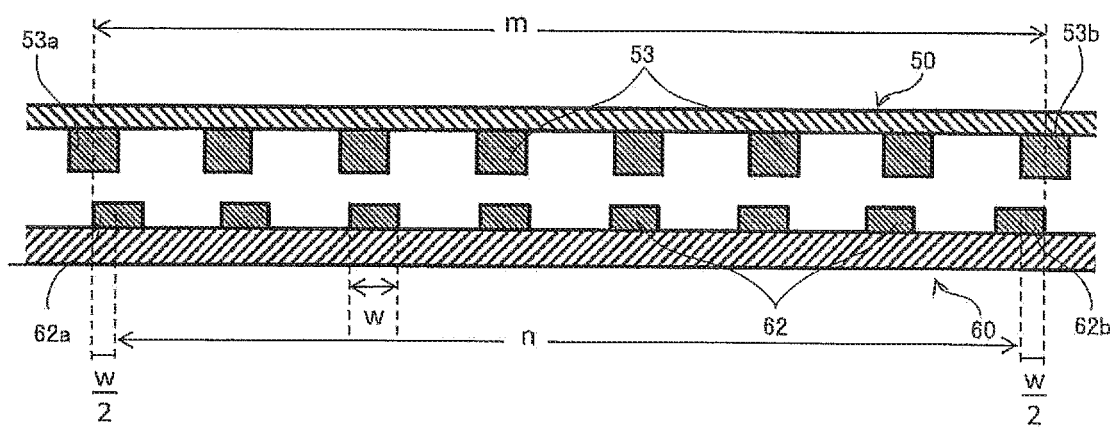
FIGS. 7A and 7B are cross-sectional view of the first circuit board and the second circuit board for explaining an electrode connecting method according to a third modification of the embodiment.
Figure 7B:
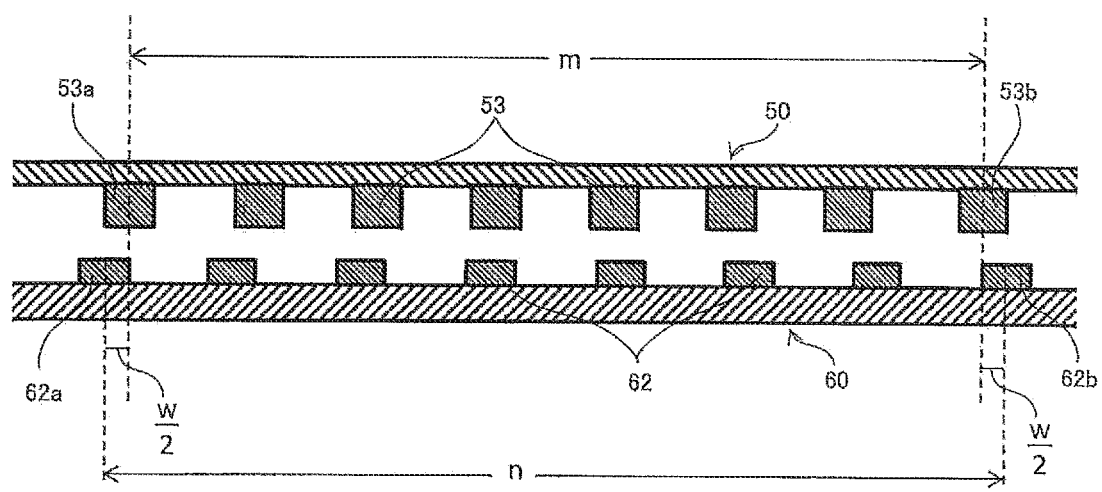

In the electrode connecting method as illustrated in FIGS. 3A-4B, the amount f of contraction of the first circuit board 50 due to the dehydration may be less than or equal to twice the width w of each of the second electrodes 62. This width w is the dimension of each of the second electrodes 62 in the arrangement direction at the normal temperature in the normal-humidity state. In this configuration, as illustrated in FIG. 7A, each of the opposite end first electrodes 53 (the first electrodes 53a, 53b) of the first electrodes 53 is located on an outer side of a corresponding one of opposite end second electrodes 62 (second electrodes 62a, 62b) of the second electrodes 62 in the arrangement region of the second electrodes 62 at a time before the dehydrating process. In the case where the length of a row m of the first electrodes 53 is maximized in the state in which the first electrodes 53 correspond to the respective second electrodes 62, each of the distance between the one-side-end first electrode 53a and the one-side-end second electrode 62a and the distance between the other-side-end first electrode 53b and the other-side-end second electrode 62b is w/2.

The first circuit board 50 is contracted in the dehydrating process performed thereafter, so that the first electrodes 53a, 53b are moved to positions located on an inner side of the respective second electrodes 62a, 62b. In the case where the length of the row m of the first electrodes 53 is minimized in the state in which the first electrodes 53 correspond to the respective second electrodes 62, each of the distance between the one-side-end first electrode 53a and the one-side-end second electrode 62a and the distance between the other-side-end first electrode 53b and the other-side-end second electrode 62b is w/2.

Thus, in the case where the first electrodes 53 is contracted by the greatest amount in the dehydrating process in the state in which the first electrodes 53 correspond to the respective second electrodes 62, the amount f of contraction of the length of the row m of the first electrodes 53 is 2w. Accordingly, by setting the amount f of contraction to an amount less than or equal to 2w, the first electrodes 53 are moved on the respective second electrodes 62 even in the case where the first circuit board 50 is contracted or expanded. This configuration makes it difficult to cause positional misalignment between the first electrodes 53 and the second electrodes 62 at the normal temperature and the normal humidity after the pressing-contact process, resulting in reduction in stress imposed on the first circuit board 50.

It is noted that the amount f of contraction of the first circuit board 50 due to the dehydration may be more preferably less than or equal to the width w of each of the second electrodes 62. More preferably, the amount f of contraction of the first circuit board 50 due to the dehydration may be greater than or equal to half the width w of each of the second electrodes 62. This configuration further reduces stress imposed on the first circuit board 50 at the normal temperature and the normal humidity after the pressing-contact process.

Fourth Modification

In the electrode connecting method as illustrated in FIGS. 3A-4B, the amount f of contraction of the first circuit board 50 due to the dehydration may be less than or equal to the second distance d. This second distance d is a dimension between adjacent two of the second electrodes 62 at the normal temperature in the normal-humidity state. If the amount f of contraction of the first circuit board 50 is large, when the first circuit board 50 is contracted in the dehydrating process, the first electrode 53 may be fitted in between the adjacent second electrodes 62. In this modification, however, since the amount f of contraction of the first circuit board 50 is less than or equal to the second distance d, the first electrodes 53 are positioned on the respective second electrodes 62 in the state in which the first electrodes 53 are opposed to the respective second electrodes 62. This configuration results in reduced positional misalignment between the first electrodes 53 and the second electrodes 62 at the normal temperature and the normal humidity after the pressing-contact process, thereby reducing stress imposed on the first circuit board 50.

Fifth Modification

In the electrode connecting method as illustrated in FIGS. 3A-4B, the amount f of contraction of the first circuit board 50 due to the dehydration may be less than or equal to one third of the second distance d. This second distance d is a dimension between adjacent two of the second electrodes 62 at the normal temperature in the normal-humidity state. This configuration further reduces positional misalignment between the first electrodes 53 and the second electrodes 62 at the normal temperature and the normal humidity after the pressing-contact process, resulting in further reduced stress imposed on the first circuit board 50.

Sixth Modification

In all the above-described electrode connecting methods, the following relationship may be satisfied: $w/2 < (a \times Tc - b \times Tm) \times z < w$, where a is the thermal expansion rate of the first circuit board 50, b is the thermal expansion rate of the second circuit board 60, Tc is the temperature of the first circuit board 50 in the pressing-contact process, Tm is the temperature of the second circuit board 60 in the pressing-contact process, w is the width of each of the second electrodes 62, and z is the dimension of connection between the first circuit board 50 and the second circuit board 60. This dimension z is a shorter one of (i) the length of the row m of the first electrodes 53 at the normal temperature in the normal-humidity state before the dehydrating process and the heating process and (ii) a diameter between the opposite end second electrodes 62a, 62b of the arranged second electrodes 62 (i.e., the length of a row n of the second electrodes 62).

The first circuit board 50 is contracted in the dehydrating process by the same dimension as a difference $\{(a \times Tc - b \times Tm) \times z\}$ in amount of expansion between the first circuit board 50 and the second circuit board 60 in the heating process. As a result, the first circuit board 50 is contracted by an amount at least greater than half the width w of each of the second electrodes 62 and less than the width w, thereby reducing stress imposed on the first circuit board 50 at the normal temperature and the normal humidity after the pressing-contact process.

Seventh Modification

While the first circuit board 50 is dehydrated by heating in all the above-described electrode connecting methods, a method of dehydration is not limited to heating. For example, the first circuit board 50 may be dehydrated in a dry warehouse. In this case, the dry warehouse is not heated and contains a drying agent such as silica gel.

Eighth Modification

Figure 8:
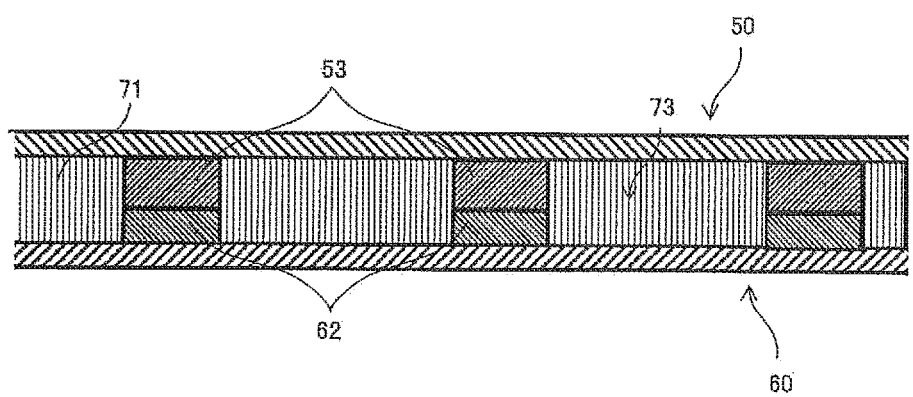
FIG. 8 is a cross-sectional view of the first circuit board and the second circuit board for explaining an electrode connecting method according to an eighth modification of the embodiment.

While the thermosetting adhesive 70 is the ACF in all the above-described electrode connecting methods, the present disclosure is not limited to this configuration. For example, a non-conductive film (NCF) in the form of a non-conductive resin bonding film is used as a thermosetting adhesive 73. This NCF does not contain the conductive particles 72. In this case, as illustrated in FIG. 8, the first electrodes 53 and the respective second electrodes 62 are brought into direct contact with each other, without the conductive particles 72 interposed therebetween, and thereby electrically connected to each other.

Ninth Modification

Figure 9A:
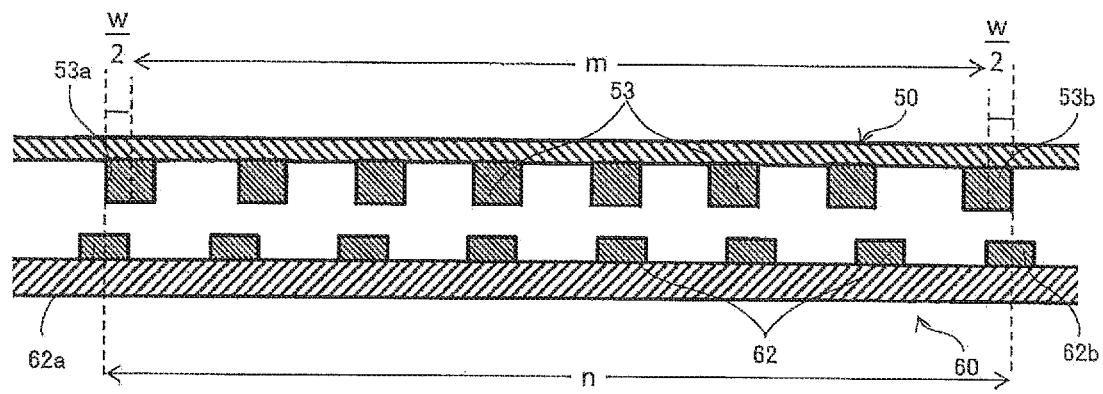
FIGS. 9A and 9B are cross-sectional views of the first circuit board and the second circuit board for explaining an electrode connecting method according to a ninth modification of the embodiment.

The particular permissible range in the producing process may be set to a relationship "n−w≤m≤n+w" in all the above-described electrode connecting methods, where, as illustrated in FIG. 9A, m is the length of the row of the first electrodes 53 (i.e., the dimension between the contacts of the respective opposite end first electrodes 53a, 53b) at the normal temperature in the normal-humidity state, n is the length of the row of the second electrodes 62 (i.e., the dimension between the contacts of the respective opposite end second electrodes 62a, 62b) at the normal temperature in the normal-humidity state, and w is the dimension (the width) of each of the second electrodes 62 in the arrangement direction. The normal temperature is 20° C.±15° C., for example, which is a temperature not required to perform heating and cooling for connection between the first electrodes 53 and the respective second electrodes 62 in particular. The normal humidity is a humidity in which a relative humidity is greater than or equal to 45% and less than or equal to 85%, for example. In particular, the normal humidity is a humidity not required to perform humidification and dehumidification for connection between the first electrodes 53 and the respective second electrodes 62.

Figure 9B:
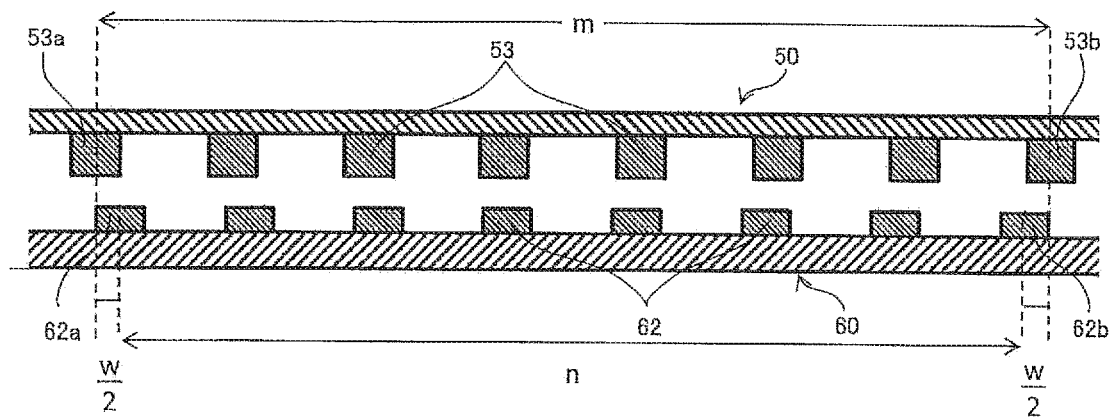

Thus, the length m of the row of the first electrodes 53 is set within the range from the length illustrated in FIG. 9A (m=n−w) to the length illustrated in FIG. 9B (m=n+w) in the producing process at the normal temperature and the normal pressure, whereby each of the first electrodes 53 and the corresponding second electrode 62 are opposed to and overlap each other. Accordingly, each of the first electrodes 53 and the corresponding second electrode 62 are opposed to and overlap each other even at the normal temperature and the normal pressure after the pressing-contact process, whereby each of the first electrodes 53 and the corresponding second electrode 62 are electrically connected to each other.

Tenth Modification

In all the above-described electrode connecting methods, a cumulative pitch correction rate m/n may be set at 1.0 as the particular permissible range in the producing process. With this configuration, each of the first electrodes 53 and the corresponding second electrode 62 are opposed to and overlap each other even at the normal temperature and the normal pressure after the pressing-contact process, whereby each of the first electrodes 53 and the corresponding second electrode 62 are electrically connected to each other.

The above-described embodiment and modifications may be combined with each other unless the combination eliminates the technical features of the embodiment and modifications. It is to be understood that the disclosure is not limited to the details of the illustrated embodiment, but may be embodied with various changes and modifications, which may occur to those skilled in the art, without departing from the spirit and scope of the disclosure.

What is claimed is:

1. An electrode connecting method, comprising:
    a step of producing (i) a first circuit board comprising a plurality of first electrodes spaced from each other at a first distance and (ii) a second circuit board having a thermal expansion rate less than that of the first circuit board and comprising a plurality of second electrodes spaced from each other at a second distance, such that a difference in dimension between the first distance and the second distance falls within a particular permissible range;
    a dehydrating step of dehydrating the first circuit board so as to reduce the first distance to become less than the second distance;
    a step of causing the plurality of first electrodes and the plurality of second electrodes to be respectively opposed to each other in a state in which the first distance is less than the second distance, with a thermosetting adhesive interposed between the first circuit board and the second circuit board;
    a heating step of heating the thermosetting adhesive and at least the first circuit board of the first circuit board and the second circuit board such that the first distance is increased by an amount greater than that of an increase in the second distance; and
    a step of bringing the first circuit board and the second circuit board into pressing contact with each other.

2. The electrode connecting method according to claim 1, wherein the first circuit board is dehydrated in the dehydrating step such that an amount of contraction of the first circuit board by dehydration becomes greater than or equal to an amount of contraction of the first circuit board by change in temperature from a heated temperature in the heating step, to a normal temperature.

3. The electrode connecting method according to claim 1, wherein the first circuit board is dehydrated in the dehydrating step such that an amount of contraction of the first circuit board by dehydration becomes equal to an amount of contraction of the first circuit board by change in temperature from a heated temperature in the heating step, to a normal temperature.

4. The electrode connecting method according to claim 1, wherein the first circuit board is dehydrated in the dehydrating step such that an amount of contraction of the first circuit board by dehydration becomes less than or equal to twice a width of each of the plurality of second electrodes.

5. The electrode connecting method according to claim 1, wherein the first circuit board is dehydrated in the dehydrating step such that an amount of contraction of the first circuit board by dehydration becomes less than or equal to a width of each of the plurality of second electrodes.

6. The electrode connecting method according to claim 1, wherein the first circuit board is dehydrated in the dehydrating step such that an amount of contraction of the first circuit board by dehydration becomes greater than or equal to half a width of each of the plurality of second electrodes.

7. The electrode connecting method according to claim 1, wherein the first circuit board is dehydrated in the dehydrating step such that an amount of contraction of the first circuit board by dehydration becomes less than or equal to the second distance.

8. The electrode connecting method according to claim 1, wherein the first circuit board is dehydrated in the dehydrating step such that an amount of contraction of the first circuit board by dehydration becomes one third of the second distance.

9. The electrode connecting method according to claim 1, wherein a following relationship is satisfied: $w/2 < (a \times Tc - b \times$ Tm)×z<w, where a represents a thermal expansion rate of the first circuit board, b represents a thermal expansion rate of the second circuit board, Tc represents a temperature of the first circuit board at a time when the first circuit board and the second circuit board are brought into pressing contact with each other, Tm represents a temperature of the second circuit board at the time when the first circuit board and the second circuit board are brought into pressing contact with each other, w represents a width of each of the plurality of second electrodes, and z represents a dimension of connection between the first circuit board and the second circuit board.

10. The electrode connecting method according to claim 1, wherein the first circuit board is dehydrated in the dehydrating step by heating the first circuit board.

11. The electrode connecting method according to claim 10, wherein the first circuit board is dehydrated in the dehydrating step by heating the first circuit board, for a time greater than or equal to five minutes and less than or equal to fifteen minutes, at a temperature greater than or equal to 120° C. and less than or equal to 170° C.

12. The electrode connecting method according to claim 1, wherein the first circuit board is dehydrated in a dry warehouse in the dehydrating step.

13. The electrode connecting method according to claim 1, wherein the first distance is less than or equal to 21 μm.

14. The electrode connecting method according to claim 1, wherein a material forming the first circuit board and a material forming the second circuit board are different from each other.

15. The electrode connecting method according to claim 1, wherein the thermosetting adhesive is an anisotropic conductive film.

16. The electrode connecting method according to claim 1, wherein a following relationship is satisfied: $n-w \leq m \leq n+w$, where m represents a distance between contacts of opposite ends of two of the plurality of first electrodes of the first circuit board at a time before dehydration, n represents a distance between contacts of opposite ends of two of the plurality of second electrodes of the second circuit board at the time before dehydration, and w represents a width of each of the plurality of second electrodes.

* * * * *